(12) United States Patent
Duparré et al.

(10) Patent No.: US 8,106,979 B2
(45) Date of Patent: Jan. 31, 2012

(54) CAMERA MODULE AND ARRAY BASED THEREON

(75) Inventors: Jacques Duparré, Jena (DE); Peter Dannberg, Jena (DE); Peter Schreiber, Jena (DE); Martin Bitzer, Apolda (DE); Andreas Bräuer, Schloben (DE)

(73) Assignees: Fraunhofer-Gesellschaft zur Forderung der Angewandten Forschung e.V., Munich (DE); Fresnel Optics GmbH, Apolda (DE)

( * ) Notice: Subject to any disclaimer, the term of this patent is extended or adjusted under 35 U.S.C. 154(b) by 583 days.

(21) Appl. No.: 11/658,620

(22) PCT Filed: Jul. 28, 2005

(86) PCT No.: PCT/EP2005/008222
§ 371 (c)(1),
(2), (4) Date: Sep. 17, 2008

(87) PCT Pub. No.: WO2006/010622
PCT Pub. Date: Feb. 2, 2006

(65) Prior Publication Data
US 2009/0050946 A1    Feb. 26, 2009

(30) Foreign Application Priority Data
Jul. 28, 2004  (DE) .................. 10 2004 036 469

(51) Int. Cl.
*H04N 5/335* (2011.01)
(52) U.S. Cl. .......... 348/294; 348/315; 348/340; 438/69; 257/432; 250/214.1

(58) Field of Classification Search .................. 348/335, 348/340, 374, 294, 315; 438/68–72; 257/56, 257/294, 432; 250/214.1
See application file for complete search history.

(56) References Cited

U.S. PATENT DOCUMENTS

| | | | |
|---|---|---|---|
| 4,348,081 A * | 9/1982 | Betensky ........................ 359/650 |
| 4,450,475 A * | 5/1984 | Ishikawa et al. ............... 348/276 |
| 5,817,396 A | 10/1998 | Perlo et al. |
| 6,285,018 B1 | 9/2001 | Aebi et al. |
| 6,331,473 B1 * | 12/2001 | Hirabayashi .................. 438/455 |
| 6,473,238 B1 * | 10/2002 | Daniell ........................ 359/622 |
| 6,513,953 B1 * | 2/2003 | Itoh ............................... 362/331 |
| 6,657,178 B2 | 12/2003 | Aebi |

(Continued)

FOREIGN PATENT DOCUMENTS

DE    29911047 U1    12/1999

(Continued)

OTHER PUBLICATIONS

Marques-Vatus et al., Analysis and potentialities of backside-illuminated thinned CMOS imagers, Proc. 2003, IEEE Workshop on CCDs and Advanced Image Sensors, Schloss Elmau, Oberbayern, Germany, May 15-17, 2003.*

(Continued)

*Primary Examiner* — Tuan Ho
*Assistant Examiner* — Kent Wang
(74) *Attorney, Agent, or Firm* — Barnes & Thornburg LLP

(57) ABSTRACT

The invention relates to the development of economical camera modules having objectives contained therein with a minimal constructional length and excellent optical properties. It is made possible as a result that camera modules of this type can be used in mobile telephones or minicomputers, such as PDAs (personal digital assistant).

17 Claims, 10 Drawing Sheets

U.S. PATENT DOCUMENTS

| | | | |
|---|---|---|---|
| 6,683,298 B1 * | 1/2004 | Hunter et al. | 250/239 |
| 6,818,962 B2 | 11/2004 | Yamamoto | |
| 7,453,510 B2 * | 11/2008 | Kolehmainen et al. | 348/340 |
| 7,663,221 B2 * | 2/2010 | Jang et al. | 257/692 |
| 2001/0003494 A1 * | 6/2001 | Kitagawa | 359/718 |
| 2002/0089596 A1 * | 7/2002 | Suda | 348/302 |
| 2004/0012698 A1 | 1/2004 | Suda et al. | |
| 2004/0036010 A1 * | 2/2004 | Hsieh et al. | 250/208.1 |
| 2004/0047047 A1 * | 3/2004 | Yamaguchi et al. | 359/666 |
| 2004/0095502 A1 | 5/2004 | Losehand et al. | |
| 2004/0189853 A1 * | 9/2004 | Takeuchi et al. | 348/340 |
| 2005/0007480 A1 * | 1/2005 | Hamano et al. | 348/335 |
| 2005/0024520 A1 | 2/2005 | Yamamoto | |
| 2005/0030392 A1 * | 2/2005 | Lee et al. | 348/241 |
| 2005/0068634 A1 * | 3/2005 | Miyatake et al. | 359/676 |
| 2005/0077458 A1 * | 4/2005 | Ma et al. | 250/239 |
| 2008/0122966 A1 * | 5/2008 | Feng et al. | 348/340 |

FOREIGN PATENT DOCUMENTS

| | | |
|---|---|---|
| DE | 69627088 T2 | 4/2004 |
| EP | 1239519 | 9/2002 |
| EP | 1414068 A2 | 4/2004 |
| JP | 63062267 | 3/1988 |
| JP | 09027606 | 1/1997 |
| JP | 2002-139662 | 5/2002 |
| WO | WO02/065751 A2 | 8/2002 |
| WO | WO02069618 | 9/2002 |
| WO | WO2004027880 | 4/2004 |

OTHER PUBLICATIONS

English Language Translation of the Written Opinion of the International Searching Authority, Jan. 30, 2007.

* cited by examiner

A

B

A

B

CAMERA MODULE AND ARRAY BASED THEREON

CROSS REFERENCE TO RELATED APPLICATIONS

This application is the U.S. national phase of PCT/EP2005/008222, filed Jul. 28, 2005. PCT/EP2005/008222 claims the benefit of the filing date of DE 10 2004 036 469.9 filed Jul. 28, 2004. The entireties of PCT/EP2005/008222 and DE 10 2004 036 469.9 are hereby incorporated herein by reference.

The invention relates to the development of economical camera modules having objectives contained therein with a minimal constructional length and excellent optical properties. It is made possible as a result that camera modules of this type can be used in mobile telephones or minicomputers, such as PDAs (personal digital assistant).

It is increasingly demanded by the manufacturers of mobile telephones and portable minicomputers to reduce the size of digital cameras to be used. In order not to delay the miniaturisation of the electronics, the imaging lenses must correspondingly have shorter and shorter dimensions. It is hence desirable to achieve, for a given visual field and image field, the minimum possible constructional length whilst maintaining the optical imaging quality.

In the case of the assembly variants known from prior art, the components of the lenses are manufactured individually at present, combined to form objectives and positioned individually relative to the image-producing optoelectronic unit, e.g. CCD or CMOS matrices. This represents great assembly complexity which leads to high costs and inconsistent maladjustments and hence rejects.

U.S. Pat. No. 4,348,081 describes a projection objective for the display of a cathode ray tube, the objective having an element which serves for correction of diaphragm-dependent aberration, a biconvex element and an element which serves as image field flattener. Miniaturisation in this case is not however at issue since there is no substantial requirement for this in the field of cathode ray tubes.

Starting therefrom, it was the object of the present invention to provide a camera module having a miniaturised objective, which can be produced on wafer scale and thus significantly reduces the assembly complexity and the production costs for the camera modules.

This object is achieved by the camera module having the features of claim 1, the array from such camera modules having the features of claim 18 and the method for producing a camera module having the features of claim 20. The use of the camera modules according to the invention is described in claim 30. The further dependent claims reveal advantageous developments.

According to the invention, a camera module is provided comprising a miniaturised objective having a support structure made of quartz glass and/or Pyrex with an IR barrier filter, disposed on the visual field side, comprising a dielectric layer system, and an image-producing optoelectronic unit, disposed on the image field side, and also at least one monolithic, aspherical optical lens plate made of a polymer material.

This invention confers the advantage that microoptic technologies, such as UV replication or hot stamping in plastic, can be used which enable highly precise and economical production of a plurality of similar optical elements in parallel on a substrate. Stamping tools are generated by galvanic moulding of precision diamond-machined master structures. The assembly of the high-quality objectives for construction of the required plurality of optical components takes place on wafer scale. Due to the assembly on wafer scale, it becomes financially viable for the first time to use more than two optical elements for objectives of this type. Thus, compared with objectives produced in the standard manner, excellent optical quality of the optical imaging can be achieved by the present invention, which at the same time involves low costs.

Preferably a CMOS sensor which is thinned and rear-illuminated is used as image-producing optoelectronic unit. For this purpose, the objective need not necessarily operate telecentrically. By adapting the objective design to a CMOS sensor, new design degrees of freedom are produced which enable drastic shortening of the lenses. Wide angles of incidence on the image-producing sensor, i.e. image-side main beam angle, are not problematic when using thinned CMOS sensors which are illuminated through the rear side since fewer shadow effects occur here of the active pixels due to printed circuit boards and electrode structures or due to the thin colour filters which are situated very close in front of the active pixel areas and hence there is a low risk of cross colour. Doing without image-side telecentricity, compared with normal objectives, allows an unconventional beam path and hence, solely because of the geometry, a significant reduction in the system length.

In a further preferred variant, a CCD sensor can also be used in the camera module as image-producing optoelectronic unit.

With respect to the lens plate, the latter must be adapted to a wafer scale assembly, i.e. no extreme menisci may be used. The edge and centre thicknesses of the lenses must be adjusted in orders of magnitude which are tenable for hot stamping. In a preferred variant, the individual lens plates have a plano-convex and/or plano-concave surface. This facilitates production of the individual lens plates. In general, biconcave and/or biconvex or convexo-concave or concavo-convex lens plates can however also be used initially in order to meet the requirements of the lens design and of the constructional length. As a result, the assembly complexity of the front and rear-side tools is however increased.

There are used preferably as polymer materials for the production of the lens plates, polymethylmethacrylate (PMMA), polycarbonate, polystyrene, cycloolefin polymer (COP), cycloolefin copolymer (COC) or other polymers on a polycycloolefin basis, for example Zeonex. Thus, PMMA is distinguished by its low dispersion, on the other hand it is not very stable thermally or with respect to air humidity. On the other hand, polycarbonate is highly dispersive but is very stable mechanically, thermally and with respect to air humidity. Combinations of crown- or heavy flint-like polymers are possible for achromatisation.

In a preferred variant, the objective has at least two lens plates. It is thereby particularly preferred if the at least two lens plates have different dispersion characteristics and hence the achromatisation of the objective is adjustable.

It is preferred furthermore if a spacing-defining element is disposed between two lens plates, in the form of a non-transparent polymer plate having a conical recess which forms the system aperture. This operates therefore as light protection funnel for restricting the visual field of the lens and hence for reducing scattered light.

At least one of the lens plates is configured preferably as an element which flattens the image field, from which a significantly improved optical imaging quality results over the entire visual field of the objective. This takes place directly in front of the image plane.

The IR barrier filter preferably comprises a dielectric layer system which is preferred for mechanical-thermal reasons. The IR barrier filter can thereby be designed such that, even for a wide spectrum of angles of incidence, the function is fulfilled by the lack of telecentricity of the imaging. This is also produced on wafer scale and introduced at a corresponding position into the lens-component stack.

A special filter design is required in order to take into account the wide angle of incidence band width and the polymer material of the at least one lens plate as superstrate and to achieve minimal displacement of the band edge as a function of the angle of incidence.

As support structure for the image-producing optoelectronic unit, disposed on the image field side, and the IR barrier filter, disposed on the visual field side, those made of quartz glass and/or Pyrex are used. These confer the advantage that they meet the requirements of the production and bonding processes with respect to a large temperature interval for the connection of the sensor to the support.

The camera module according to the invention is designed such that the constructional length of the camera module from the image plane to the first surface of the camera module is in the range of 1 mm to 10 mm, particularly preferred from 3 mm to 5 mm.

According to the invention, likewise an array comprising camera modules according to the invention is provided, in which a multiplicity of camera modules is disposed on a single support structure. From 2 to several thousand camera modules can hereby be disposed on the support structure.

Likewise, a method for producing a camera module according to the invention is provided according to the invention, in which a lens plate is produced on wafer scale by hot stamping or UV replication. Furthermore, an image-producing optoelectronic unit is applied on a support structure on the image field side and, on the visual field side, an IR barrier filter by wafer technology. The lens plate is connected to the IR barrier filter by a UV or thermally curable adhesive on the visual field side and the individual camera modules are separated by means of saw blades.

The process of separation of the individual camera modules can be started within the scope of the invention according to the application at various points in the process chain. The highest integration is achieved if the image-producing optoelectronic unit and the necessary printed circuit board are also connected to the lens wafer on wafer scale and thus the separation takes place only after assembly of all the components required for a digital camera. In this way, adjustment of the elements of a module can be implemented not modulewise and hence macroscopically and only with limited precision, but rather for a large group of modules on one wafer with one adjustment step and lithographical precision by thus produced adjustment structures on the wafers.

The spacing-defining element is produced preferably by hot stamping, injection moulding or boring out of a non-transparent polymer plate.

A further preferred embodiment variant provides that the spacing-defining element is glued to the at least one lens plate by a UV or thermally curable adhesive.

The assembly of the wafer stack can be implemented with the assistance of adjustment structures on the individual wafers. As a result, precision during production can be significantly increased, the production complexity being simultaneously reduced by simultaneous adjustment of a plurality of camera modules.

The camera modules according to the invention are used in particular in the production of mobile telephones or portable minicomputers (personal digital assistant, PDA).

A preferred embodiment of the camera module according to the invention is described subsequently with reference to the construction thereof.

The refractive possibly aspherical optical components on wafer scale form the imaging optical system. These comprise three hot stamped lens plates made of PMMA and a non-transparent polymer plate which defines a spacing and system aperture and has conical holes. The optical components are thereby preferably self-adjusting or connected to each other so as to be alignable relative to each other by adjustment marks on wafer scale. It should hereby be understood that the actual optically relevant lens surfaces are correspondingly lower in depth or offset in the lens plates. Furthermore, the camera module has a support made of quartz glass or Pyrex, on the image field side of which the image-producing optoelectronic unit, e.g. a CMOS sensor, is disposed. A support made of polymer material is not so advantageous here since the thermal coefficient of expansion thereof is too great to be adapted to that of the CMOS sensor which comprises silicon, which would result in destruction thereof. Furthermore, the camera module according to the invention has an IR barrier filter as dielectric layer system which is applied onto the support structure on the visual field side. A special filter design is hereby necessary in order to take into account the large angle of incidence band width and the polymer materials for the lens plates as substrate and to achieve a minimum displacement of the band edge as a function of the angle of incidence. The lens shapes must thereby be adapted to a wafer scale assembly, i.e. extreme menisci must be avoided. The edge and centre thicknesses of the lenses must be adjusted in orders of magnitude which are tenable for hot stamping. It is furthermore advantageous to effect a shear point for lateral sawing faces which are produced when dividing the optowafer in order to minimise the scattered light. Furthermore, coatings for anti-reflection can be applied on wafer scale. The coating of the visual field side surface should thereby advantageously be effected with a moisture-repellent and scratch-resistant coating. Planar faces situated within the objective can be provided for example with moth eye structures for anti-reflection. The production of these structures can be made possible in a simple manner by the choice of the corresponding stamping tool for the rear side of a lens wafer during moulding of the lens structures on the front side. Anti-reflection of the lens structures themselves can be effected preferably by dielectric layer systems. However also structuring of the curved surfaces of the lenses with moth eye structures is conceivable.

The arrangement of the lenses in the module, which is sawn from the wafer stack, must furthermore ensure that light which impinges from sources outwith the visual field into the system aperture, does not pass by reflection or refraction on optical interfaces outwith the used lens opening back onto the image receiver. This would result in a reduction in contrast or generation of ghost images. It follows from scattered light simulation that especially the transitions between the lenses which serve for definition of the lens spacing are critical in this relationship. Enlargement of the free opening at these transitions is therefore crucial, that light itself which impinges in the system opening at the greatest possible angle of incidence is not reflected or refracted back to the sensor.

The subject according to the invention is now intended to be described in more detail with reference to the subsequent Figures and examples, without the latter being restricted to the special embodiments mentioned here.

Figure 1:
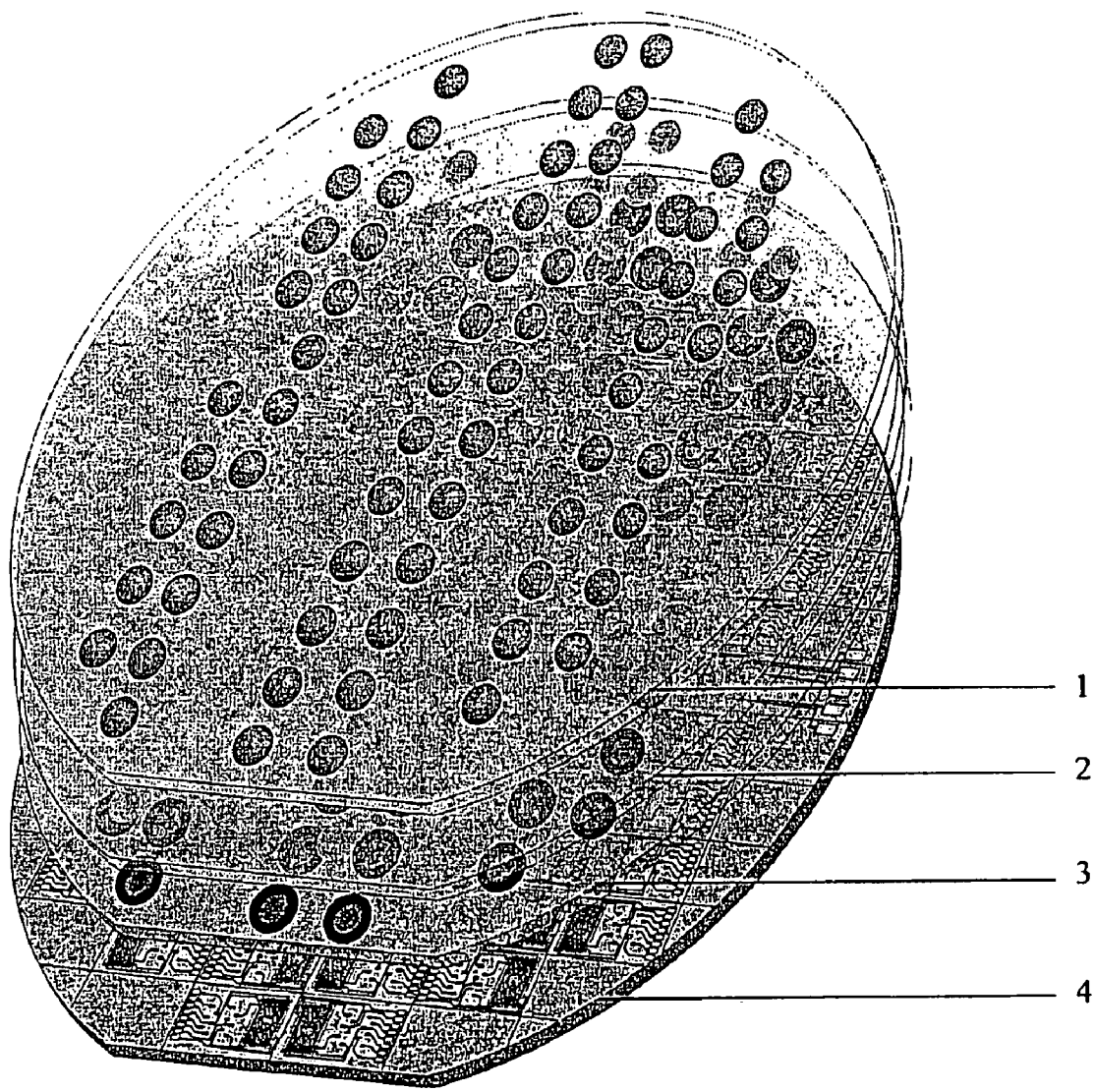
FIG. 1 shows a schematic representation of an array comprising camera modules.

FIG. 1 shows the representation of the production in principle of miniaturised objectives on wafer scale with reference to the arrangement of a preferred embodiment variant. Three lens plates 1, 2 and 3 which are hot-stamped in polymer form the lens wafer stack. The absorbing spacer 5 is not shown here. A quartz glass plate 4 which supports, on its front side, the IR barrier filter and, on the rear side, the image-converting optoelectronic unit, here a thinned and rear-illuminated CMOS sensor, is connected to the lens wafer stack in order to form the array of camera modules on wafer scale.

Figure 2:
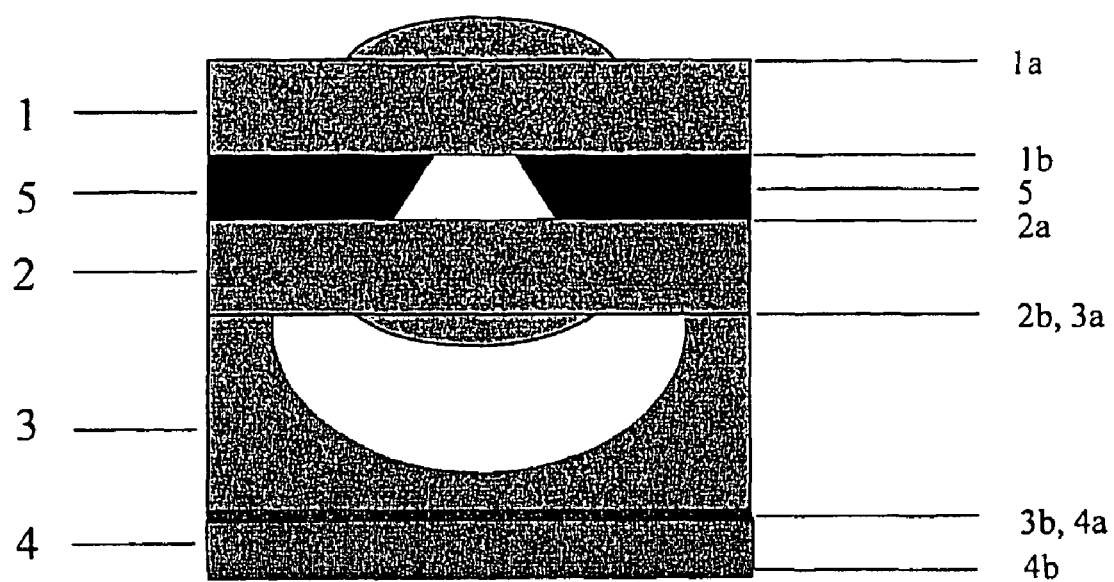
FIG. 2 shows the construction of a camera module in a schematic representation.

FIG. 2 shows a separated camera module comprising lenses in polymer 1, 2 and 3 with planar 1b, 2a, 3b and convex 1a, 2b or concave 3a surfaces, IR barrier filter 4a on the front side of the quartz glass substrate 4 and thinned and rear-illuminated CMOS sensor on the rear side 4b, absorbing polymer plate 5 which forms the system aperture with a conical opening and serves as spacer between the surfaces 2b and 3a.

Figure 3:
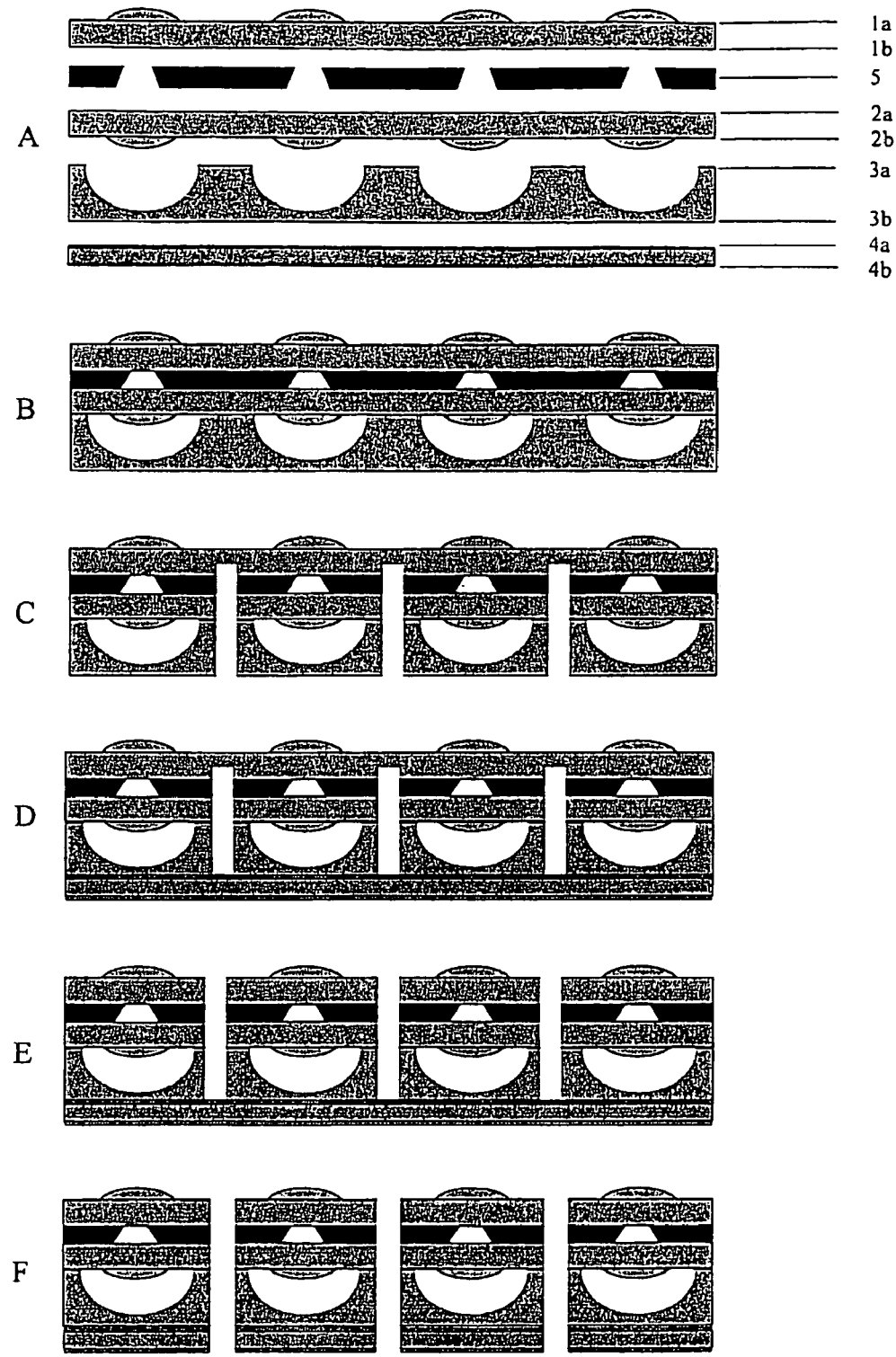
FIG. 3 shows an example of a process chain for the production of the camera modules.

FIG. 3 shows a proposal for a process chain for producing miniaturised digital cameras on wafer scale with reference to the above-described embodiment variant.

FIG. 3A: production of the lens plates 1, 2 and 3 with planar 1b, 2a, 3b and convex 1a, 2b or concave surfaces by hot stamping in polymer. Generation of the IR barrier filter on the front side of the quartz glass substrate 4a and subsequent application of the thinned CMOS sensor to be rear-illuminated on the rear side 4b. Production of the absorbing polymer plate 5, which forms the system aperture of the individual modules with a conical opening and serves as spacer between the surfaces 2b and 3a, by hot stamping, injection moulding or boring out of plates of the correct thickness.

FIG. 3B: assembly and adjustment of the individual polymer component wafers, gluing with UV or thermally-curable adhesives.

FIG. 3C: rear pre-sawing of the polymer wafer stack with saw blades adapted to polymer.

FIG. 3D: assembly, adjustment and UV or thermally-curable gluing of the polymer wafer stack to the quartz glass plate supporting the IR barrier filter and the CMOS sensor.

FIG. 3E: cutting through the remaining supporting polymer structures of the polymer wafer stack with suitable saw blades.

FIG. 3F: cutting through the quartz glass plate with adapted saw blade. The result is the separation of the camera modules.

Figure 4:
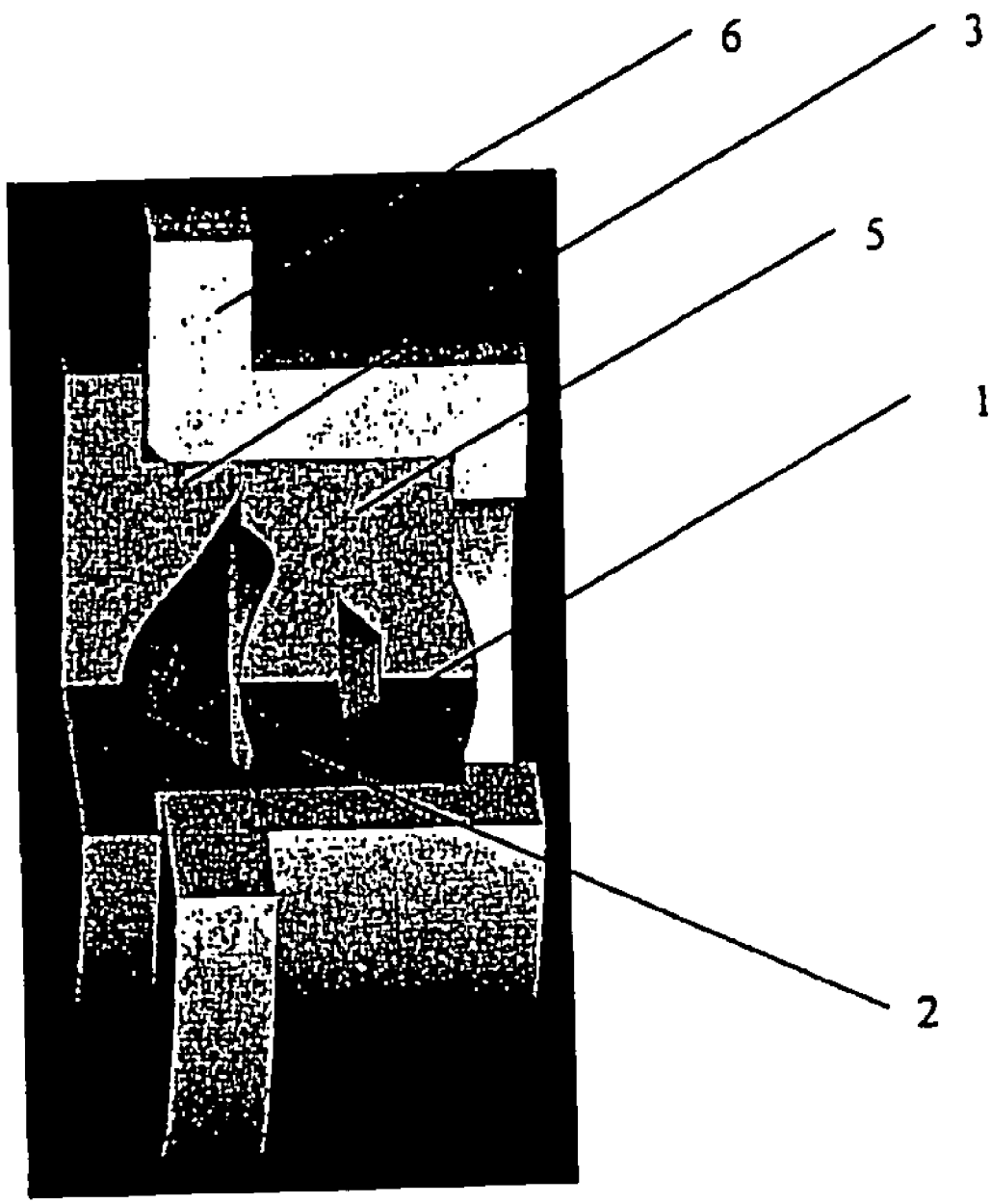
FIG. 4 shows the construction of a camera module according to the invention in perspective representation.

FIG. 4 shows the stacking of the individual polymer components of a camera module to form a sandwich with integrated spacing. Lens plates 1, 2 and 3 and also black plate 5 for definition of the system aperture and of the spacing of the lenses 1 and 2. The spacing definition between the lenses 2 and 3 is determined via the depth or form of the lens plates 2 and 3. In this embodiment variant, also the components of the individual modules can be separated before assembly and moved into the correct centring by the form of the cylinder 6 which receives them.

Figure 5:
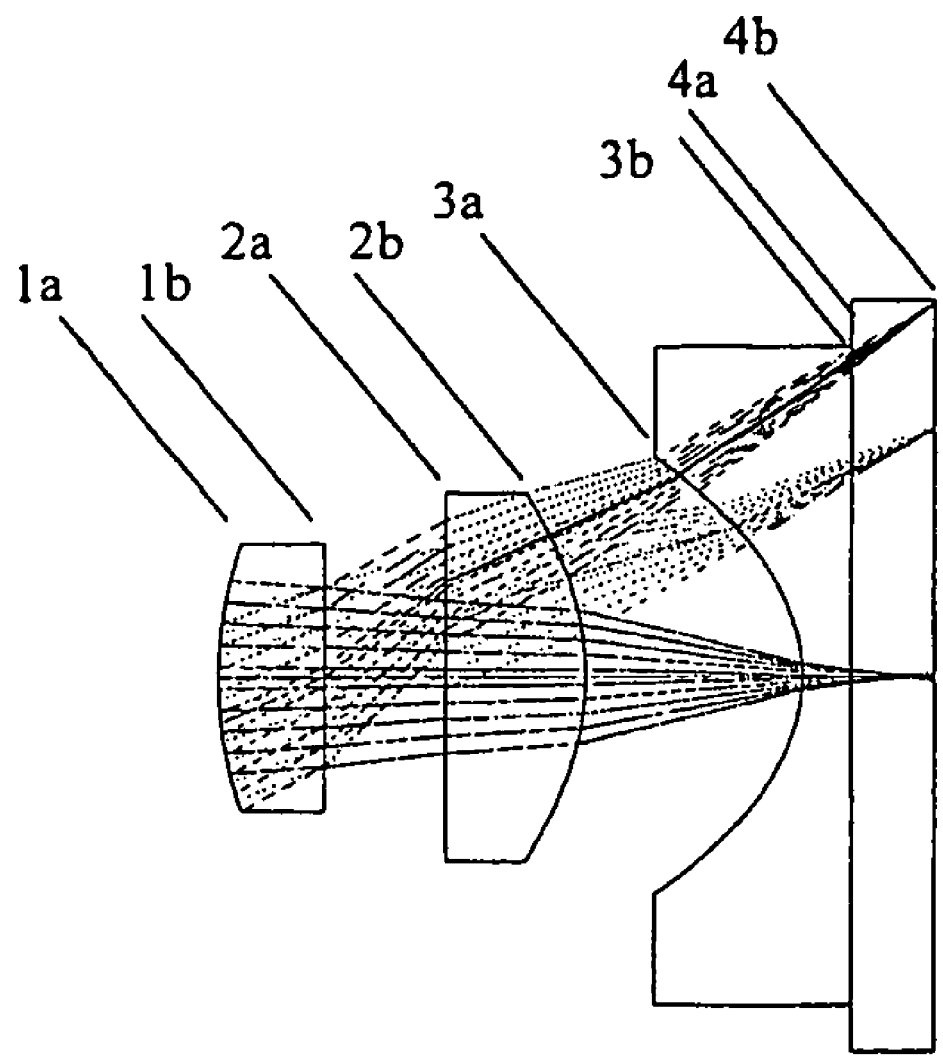
FIG. 5 shows a schematic representation of the optical arrangement in the camera module according to the invention.

FIG. 5 shows a section through the rotational-symmetrical optical arrangement. The diameter of the image circle is 4.56 mm, the system length from the first lens surface 1a to the image plane 4b is 4.32 mm. The field angles represented are 0°, 25° and 35°.

The lenses in PMMA 1, 2 and 3 are illustrated with planar 1b, 2a, 3b and convex 1a, 2b or concave 3a surfaces, IR barrier filter on the front side of the quartz glass substrate 4a and thinned and rear-illuminated CMOS sensor on the rear side 4b.

Figure 6:
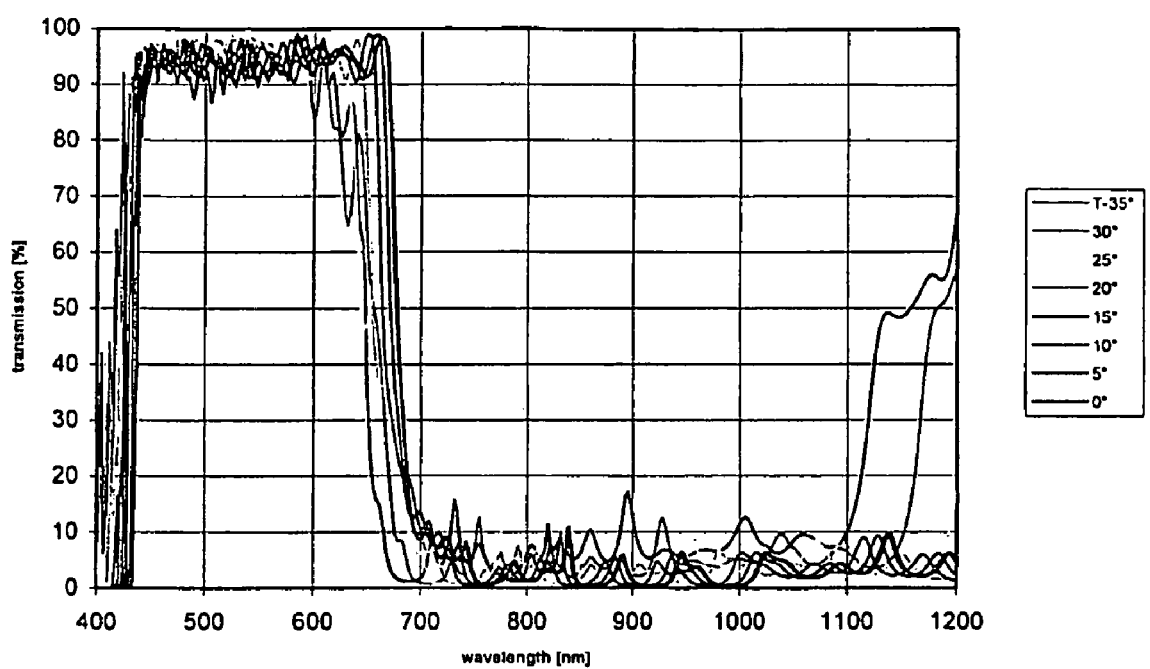
FIG. 6 shows the transmission curve of an IR barrier filter used according to the invention.

FIG. 6 shows a transmission curve of the specially adapted IR barrier filter with the angle of incidence in PMMA as parameter. The transmission of the filter is plotted as a function of the wavelength for different angles of incidence. The band edge is at approx. 650 nm (50% transmission). The band edge displacement with the angle of incidence was able to be reduced by a special filter design.

Figure 7:
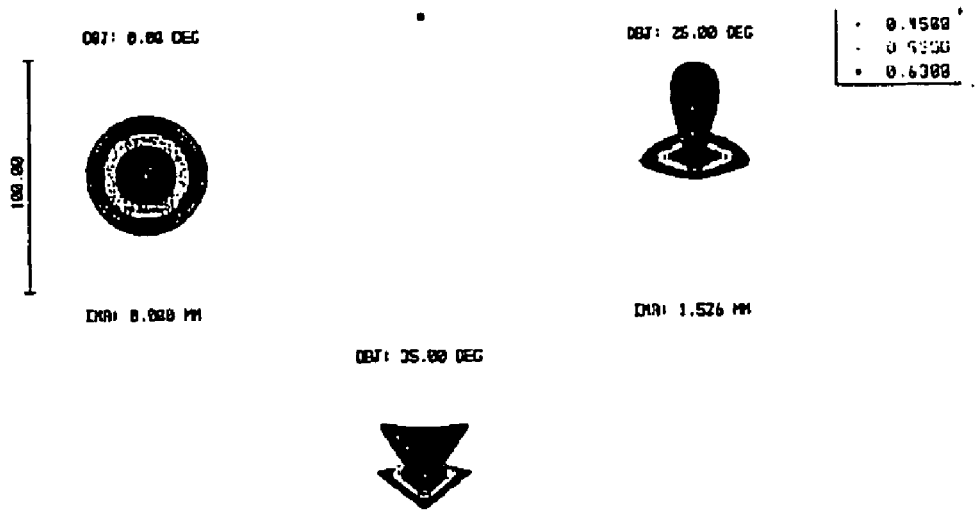
FIG. 7 shows the RMS spot radii of a camera module according to the invention in a diagram.

FIG. 7 shows a diagram which shows that spots are produced by the system with RMS spot radii of 10 μm on average over the image field. The polychromatic spot images of the objective according to the invention are illustrated at three different angles of incidence of 0°, 25° and 35°.

FIG. 8A shows the modulation transmission function (MTF) of the described embodiment variant plotted over the image field coordinate, respectively for the tangential and for the sagittal image direction. The parameters are three observed location frequencies. Only marginal deterioration in resolution can be read over the image field.

FIG. 8B shows the modulation transmission function (MTF) of the described embodiment variant plotted over the location frequency, respectively for the tangential and for the sagittal image direction. The parameters are three observed image field coordinates. A tolerable drop in imaging contrast with increasing fineness of image details can be read off.

FIG. 9A shows that the image field curvature (deterioration in resolution with increasing image field coordinate) and distortion (change in the imaging scale as a function of the image height) of the described embodiment variant are minimal. The curves for different wavelengths and for the tangential and sagittal image direction are shown.

FIG. 9B shows the main beam angle in the image space plotted as a function of the image field coordinate. The system is not designed telecentrically, the image-side main beam angle increases with the object-side angle of incidence which is correlated to the image field coordinate via the system focal width.

Figure 10:
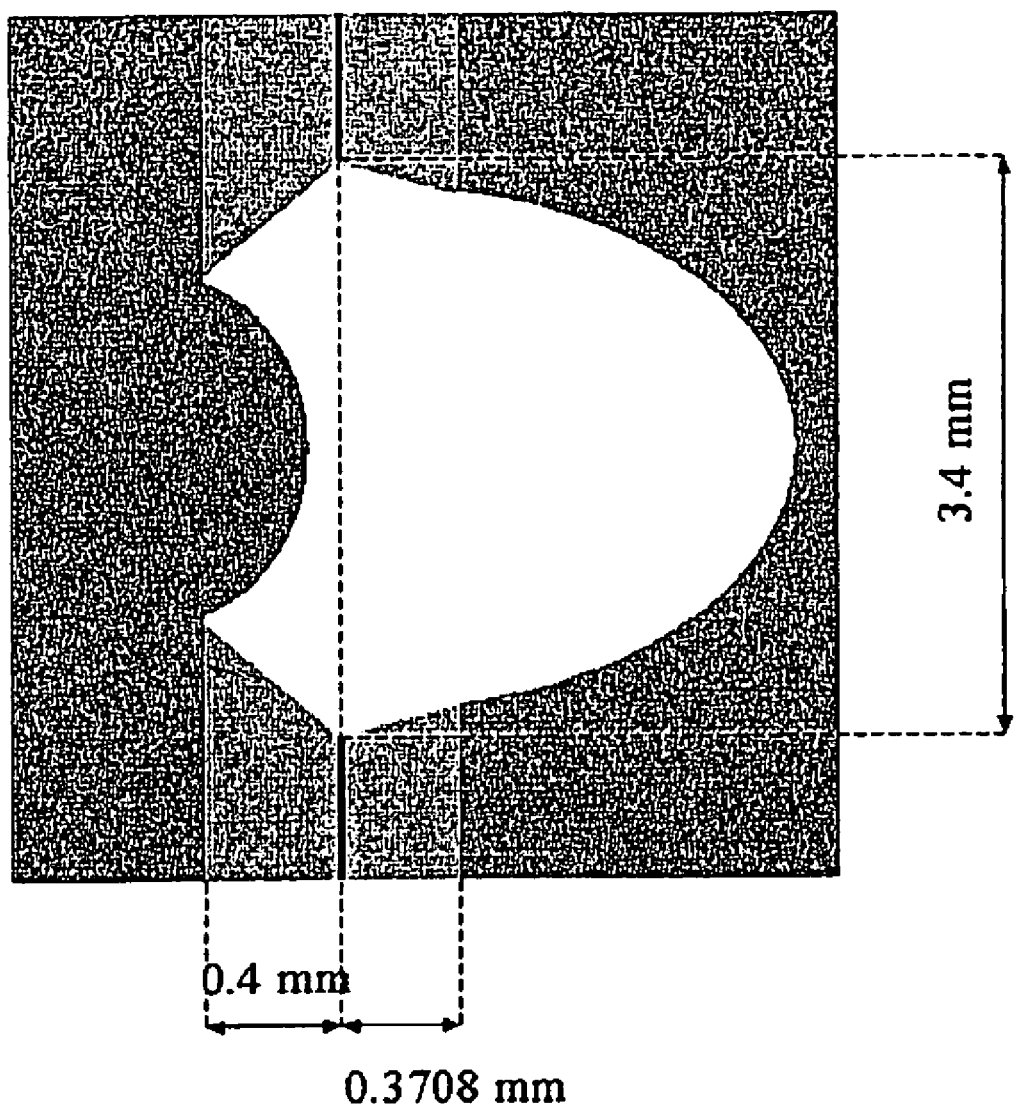
FIG. 10 shows a sectional representation at the transition of two lens plates of a camera module according to the invention.

FIG. 10 shows the transition of lens plate 2 to lens plate 3 for minimising stray light on the detector resulting from light sources outwith the visual field. Starting from the parameters of the lens plates resulting from the lens design according to FIG. 5, the lens plates must be modified such that they include spacers without however affecting the optical properties, generating stray light and unnecessarily increasing the lateral spatial requirement of the objective due to large free openings. There should be understood by "including spacers" that the actual optically relevant lens surfaces are correspondingly lower in depth or offset in the lens plates.

Example

The constructional length of the described objective shown in the Figures with VGA resolution (640×480) and 5.6 μm pixel size with a horizontal visual field (FOV) of 56° is 4.32 mm, which represents the shortest known optical system for a specification of this type relative to the state of the art. The corresponding parameters are represented in Table 1.

TABLE 1

| Parameter | Specification |
| --- | --- |
| Total length of the optical system (first surface to image plane) | 4.32 mm |
| F/# | 2.8 |
| Focal distance | 3.37 mm |
| Diameter of the image circle | 4.56 mm |
| Usable wavelength range | 450 nm-630 nm |
| FOV (full diagonal) | 70° |
| Object distance | 500 mm-infinity |

Construction of the Described Embodiment Variant:

The imaging system (FIG. 5) comprises three aspherical lens-plates in PMMA 1, 2 and 3 and a 500 μm thick quartz glass plate 4. The latter serves as a thermally and mechanically loadable support structure for an IR barrier filter on the front side 4a and a thinned and rear-illuminated CMOS sensor on the rear side 4b.

The two first lenses in the beam path in the direction of the light incidence 1 and 2 are aspherically plano-convex and serve as divided objective lens. The system opening (STOP) with a diameter of 1.11 mm is located on the planar rear side 1b of the first lens plate 1. The symmetry of the objective lenses around the system aperture leads to reduced aberrations. The F/# of the system is 2.8. Dependent upon the technological process, the STOP is produced on the surface 1b as a coating of an absorbing material (polymer) or as an additional thin absorbing polymer plate 5 (black PMMA) between the lens plates 1 and 2. 5 thereby served at the same time as spacing-defining structure for the spacing of the lens plates 1 and 2 and, by means of a suitable conical surface, as a type of light protection funnel for restricting the visual field of the lens and hence for reducing scattered light.

The third lens plate is aspherically plano-concave and serves as an element which flattens the image field and by suitable continuation, of the form of the surface 3a simultaneously for definition of the spacing to the surface 2b. By using this element which flattens the image field, it becomes possible to obtain a uniformly high MTF over the visual field of the lens.

Telecentricity is not sought in order to make a minimal constructional length possible, the main beam angles in the image space (in the material) correspond to the angles of incidence (field angles).

The described optical components can be produced by hot stamping as array structures on wafer scale. The lens plates are connected to each other by means of UV-curable adhesive, the spacing definition and adjustment structures being integrated directly into the lens plates or into the additional absorbing plate 5. The thin quartz glass plate 4 is glued onto the rear side of the PMMA lens component stack 3b. It must thereby ensured that, between the rear side of the PMMA lens component stack 3b and the CMOS sensor 4b, no air gap is allowed to exist since the latter would result partly in total reflection due to the occurring high main beam angles in the image space.

The dielectric IR barrier filter can be introduced in the arrangement only on the front side of the quartz glass substrate, on the rear side thereof the image-producing electronic unit is situated since a coating of the PMMA with the dielectric layer system is not possible due to mechanical-thermal material edge conditions. By dispensing with the telecentricity in order to obtain as short objectives as possible, the result are large main beam angles in the image space and, due to the nearness of the filter to the latter, a wide spectrum of angles of incidence for which the filter must fulfil the specifications in order to make possible white balance of the system. This fact and the fact that the superstrate of the filter is not air but PMMA, place increased demands on the filter design. In particular displacement of the cut-off wavelength to shorter wavelengths whilst increasing the angle of incidence influences the filter characteristic negatively. For this reason a filter is used which was optimised directly for a wide angle of incidence spectrum, PMMA as superstrate and the given wavelength ranges. Due to a special design of a $SiO_2/TiO_2$ layer system, it became possible to reduce this displacement of the cut-off wavelength for a spectrum of angles of incidence of 0-35° within the polymer to 30 nm. FIG. 6 shows the corresponding transmission curve of the developed filter for the described angle of incidence spectrum. The cut-off wavelength (50%), dependent upon the angle of incidence, is between 650 and 675 nm. The average transmission in the barrier region is below 3% whilst the transmission in the transparent region is greater than 85%.

Surface parameters of the described embodiment variant (Table 2):

TABLE 2

| Surface | Type | Radius | Thickness | Material | Diameter | Conic | Coeff r^6 |
| --- | --- | --- | --- | --- | --- | --- | --- |
| OBJECT | STAND | Infinity | 500 | AIR | 701.5498 | 0 | |
| 1a | ASPH | 2.593351 | 0.63004 | PMMA | 1.661869 | | −1.681042 |
| 1b (STO) | STAND | Infinity | 0.72105 | AIR | 1.108201 | | 0 |
| 2a | STAND | Infinity | 0.84714 | PMMA | 1.937082 | | 0 |
| 2b | ASPH | −1.786246 | 1.31797 | AIR | 2.285339 | 0.4358701 | 0.039834853 |
| 3a | ASPH | −1.08162 | 0.3 | PMMA | 2.70883 | −0.852709 | |
| 3b | STAND | Infinity | 0 | — | 2.70883 | 0 | |
| 4a | STAND | Infinity | 0.5 | SILICA | 4.079017 | 0 | |
| 4b | STAND | Infinity | | SILICA | 4.66547 | 0 | |

Refractive Index Data of the Described Embodiment Variant (Table 3):

TABLE 3

| Component | Material | Temp | Pressure | 0.450000 | 0.535000 | 0.630000 |
| --- | --- | --- | --- | --- | --- | --- |
| Object (Air) | | 20.00 | 1.0 | 1.00000000 | 1.00000000 | 1.00000000 |
| 1 | PMMA | 20.00 | 1.0 | 1.50102493 | 1.49442296 | 1.49007866 |
| Air gap | | 20.00 | 1.0 | 1.00000000 | 1.00000000 | 1.00000000 |
| 2 | PMMA | 20.00 | 1.0 | 1.50102493 | 1.49442296 | 1.49007866 |

TABLE 3-continued

| Component | Material | Temp | Pressure | 0.450000 | 0.535000 | 0.630000 |
|---|---|---|---|---|---|---|
| Air gap | | 20.00 | 1.0 | 1.00000000 | 1.00000000 | 1.00000000 |
| 3 | PMMA | 20.00 | 1.0 | 1.50102493 | 1.49442296 | 1.49007866 |
| 4 | SILICA | 20.00 | 1.0 | 1.46556566 | 1.46056852 | 1.45709969 |

Achromatisation is unnecessary for the described embodiment variant since only low-dispersive material (PMMA) is used.

Figure 8:
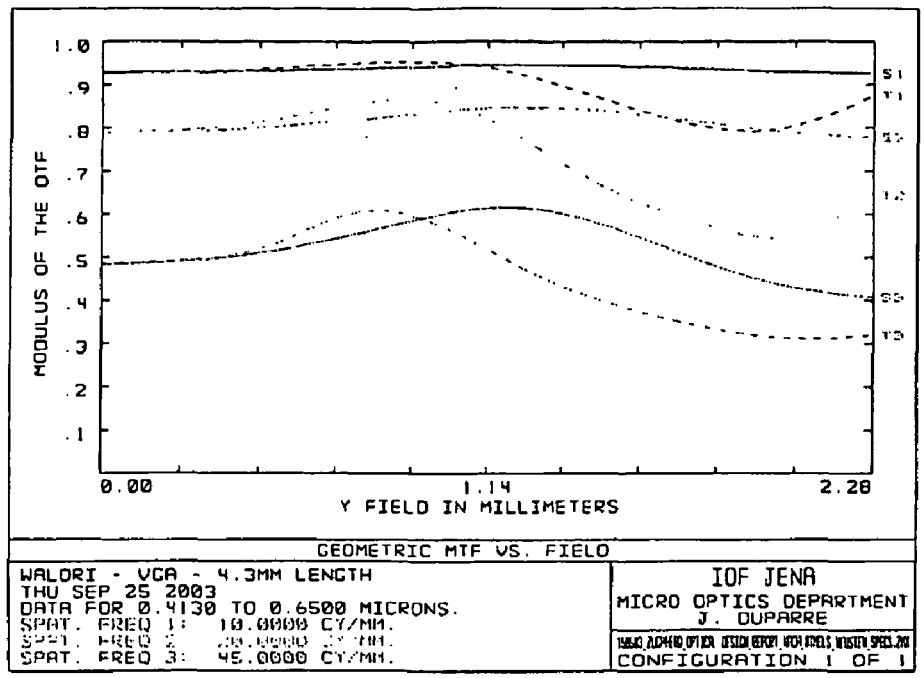
FIG. 8 shows the modulation transmission function (MTF) of a camera module according to the invention, plotted over the image field coordinate (A) or the location frequency (B).
Figure 8:
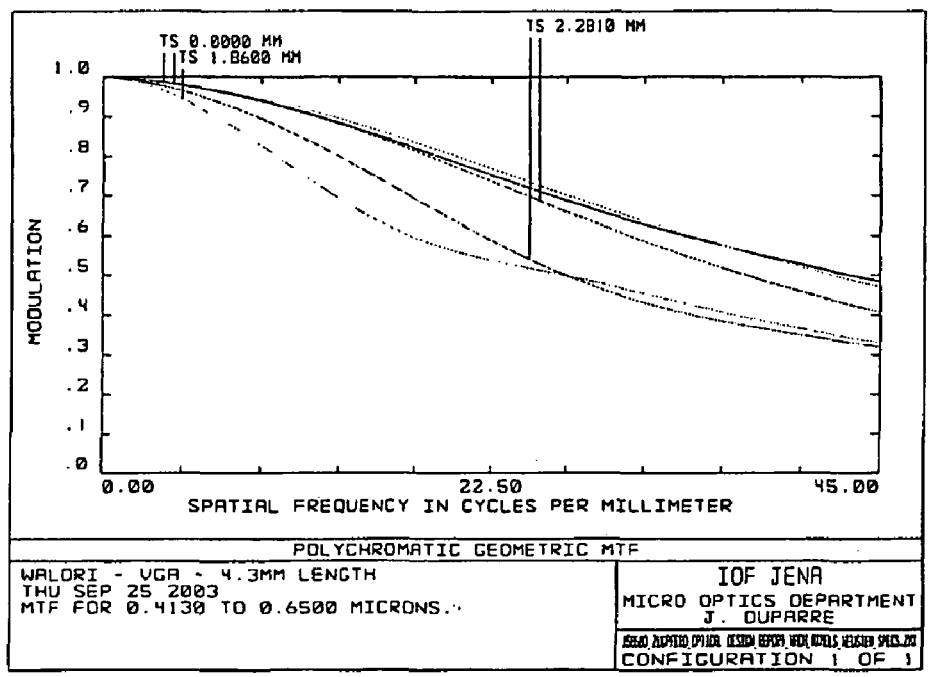
Figure 9:
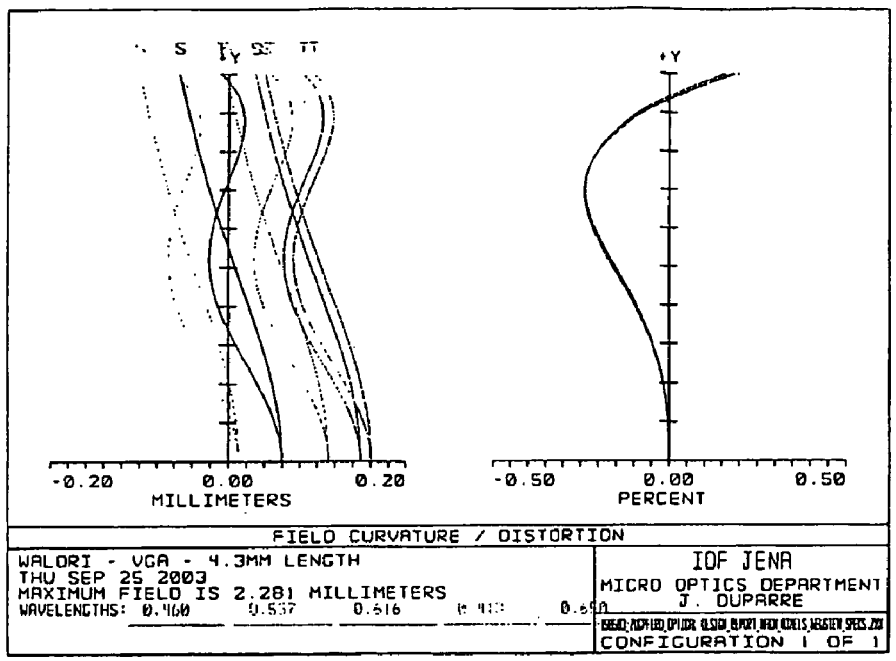
FIG. 9a shows the image field curvature and distortion of a camera module according to the invention in the diagram.
FIG. 9b shows the main beam angle in the image space, plotted as a function of the image field coordinate of a camera module according to the invention in a diagram.
Figure 9:
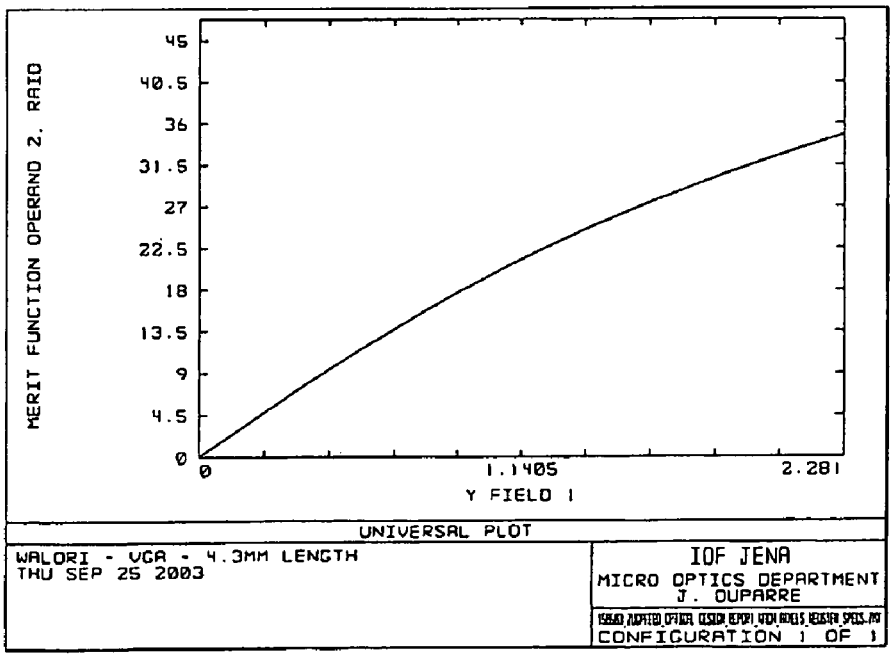

The imaging properties of the described embodiment variant are reproduced in FIGS. 7, 8 and 9. The described embodiment variant has an almost constantly high MTF over the entire image field and minimal distortion. The main beam angles in the image plane correspond to the respective angles of incidence.

The described design is in addition tolerant relative to +/−50 μm defocusing, which implies a simplified and non-critical axial adjustment of the lens wafer stack to form the image-producing electronic unit (10% enlargement of the RMS spot diameter). The tolerances of the system are non-critical since the main beams for all the field angles have only relatively small angles to the surface normals of the surfaces of the optical elements.

Scales of the length of the embodiment variant with scaling of the pixel size and hence image field size must take into account that an additional reduction of F/# is necessary in order to adapt the diffraction-caused limit of resolution to the pixel size and to maintain the detected light power.

In order to avoid stray light on the detector originating from sources outwith the visual field of the objective, firstly a system aperture 5 of great thickness and conical course was chosen (FIG. 2) which serves simultaneously as spacer of the lens plates 1 and 2 and secondly increases the free opening of the transition between the lens plates 2 and 3 to 3.4 mm (FIG. 10). The angle of the cone of the diaphragm plate 5 is chosen such that light bundles, originating from object points within the visual field of the objective which enter through the system aperture, are not vignetted. Bundles which however originate from light sources outwith the visual field are in contrast vignetted partly to completely.

The only partly vignetted bundles are critical for generation of stray light by reflection or refraction on the following interfaces, as result of which an enlargement of the free opening at the following lens plate transitions is effected so far that even light, which is incident in the system opening at the greatest possible angles of incidence, is not reflected at edges outwith the lens openings, or refracted again towards the sensor.

As a result of such a stray light-sensitive system design especially with the system aperture within the objective and not as first element, as in conventional mobile telephone cameras, and with a large thickness and not only as a thin diaphragm, the diaphragm plate 5 acts simultaneously as field diaphragm. As a result, the light protection funnels which must be placed before the actual lens for field limitation in current cameras for mobile telephones, and which significantly increase the total constructional length of the camera, can be dispensed with.

The invention claimed is:

1. A camera module having a miniaturized objective with a support structure including at least one of quartz glass and borosilicate glass having an IR barrier filter, on the visual field side, applied by wafer technology and comprising a dielectric layer system and an image-producing optoelectronic unit, on the image field side, applied by wafer technology and at least one monolithic aspherical optical lens made of a polymer material and at least one further optical lens made of a polymer material, the at least one aspherical lens including a first surface on the visual field side, the support structure being glued to the at least two lenses without an air gap, the length from the image plane to the first surface being less than about 10 mm, the camera module being formed with, and separated from an array of such camera modules, and a space-defining element comprising a non-transparent polymer plate having a conical recess which forms the system aperture, the space-defining element disposed between the two lenses, said recess acting as a field diaphragm due to the thickness thereof.

2. A camera module according to claim 1 wherein the image-producing electronic unit comprises a CMOS sensor.

3. A camera module according to claim 2 wherein the CMOS sensor is thinned and illuminated at the rear.

4. A camera module according to claim 1 wherein the image-producing electronic unit comprises a CCD sensor.

5. A camera module according to claim 1 wherein the at least one lens comprises a polymer selected from the group consisting of polymethylmethacrylate, polycarbonate, polystyrene, cycloolefin polymer, cycloolefin copolymer and polycycloolefin-based polymers.

6. A camera module according to claim 1 wherein the at least two lenses have different dispersion characteristics providing adjustable achromatization of the objective.

7. A camera module according to claim 1 wherein the at least one lens is at least one of plano-concave and plano-convex.

8. A camera module according to claim 1 wherein the at least one lens is at least one of biconvex and biconcave.

9. A camera module according to claim 1 wherein the at least one lens is at least one of concavo-convex and convexo-concave.

10. A camera module according to claim 1 wherein the objective comprises three lenses, two of said lenses on the visual field side being aspherically plano-convex and one of said lenses on the image field side being aspherically plano-concave.

11. A camera module according to claim 1 wherein the at least one lens comprises at least one of a dielectric structure and a moth eye structure on at least one side to reduce its reflectance.

12. A camera module according to claim 1 wherein the lens comprises a moisture-repellent coating on the visual field side.

13. A camera module according to claim 1 wherein the lens comprises a scratch-resistant coating on the visual field side.

14. A camera module according to claim 1 wherein the lens comprises an anti-reflective structure on the visual field side.

15. A camera module according to claim 14 wherein the anti-reflective structure comprises a moth eye structure.

16. An array of camera modules comprising camera modules according to claim 1 wherein the camera modules are disposed on a single support structure and the lenses on a single lens plate and the camera modules form a wafer stack.

17. An array of camera modules according to claim 16 comprising between 2 and several thousand camera modules disposed on the support structure.

* * * * *